US012406747B2

(12) United States Patent
Shetty et al.

(10) Patent No.: US 12,406,747 B2
(45) Date of Patent: Sep. 2, 2025

(54) MEMORY LOCATION MAPPING AND UNMAPPING (71) Applicant: Infineon Technologies LLC, San Jose, CA (US)

(72) Inventors: Shivananda Shetty, Fremont, CA (US); Stefano Amato, San Jose, CA (US)

(73) Assignee: Infineon Technologies LLC, San Jose, CA (US)

( * ) Notice: Subject to any disclaimer, the term of this patent is extended or adjusted under 35 U.S.C. 154(b) by 150 days.

(21) Appl. No.: 18/380,828

(22) Filed: Oct. 17, 2023

(65) Prior Publication Data

US 2025/0125001 A1 Apr. 17, 2025

(51) Int. Cl.
*G11C 7/00* (2006.01)
*G11C 13/00* (2006.01)
*G11C 29/00* (2006.01)
*G11C 29/52* (2006.01)

(52) U.S. Cl.
CPC .......... *G11C 29/76* (2013.01); *G11C 13/0064* (2013.01); *G11C 29/52* (2013.01)

(58) Field of Classification Search
CPC ....... G11C 7/1078; G11C 7/22; G11C 7/1006; G11C 7/1072; G11C 7/1066
USPC ............................................ 365/189.16, 200
See application file for complete search history.

(56) References Cited

U.S. PATENT DOCUMENTS

| | | | |
|---|---|---|---|
| 2009/0248959 A1 | 10/2009 | Tzeng | |
| 2018/0358111 A1 | 12/2018 | Jeddeloh et al. | |
| 2019/0227735 A1* | 7/2019 | Shaked | G06F 1/3203 |
| 2021/0313002 A1 | 10/2021 | Ning et al. | |
| 2023/0187413 A1 | 6/2023 | Yoshihara et al. | |

OTHER PUBLICATIONS

International Search Report for International Application No. PCT/US2024/051731 dated Dec. 27, 2024; 2 pages.
Written Opinion of the International Searching Authority for International Application No. PCT/US2024/051731 dated Dec. 27, 2024; 8 pages.

* cited by examiner

*Primary Examiner* — Son T Dinh (57) ABSTRACT

A method of operating a memory circuit is disclosed. The memory circuit includes a memory array having a memory portion and a spare portion. The method includes receiving a first write command to a first memory address, where the first memory address has a status of being mapped to a first spare memory address, and where the first memory address corresponds to a first memory location in the memory portion and the first spare memory address corresponds to a first spare memory location in the spare portion. The method also includes performing, in response to the first write command, a first write operation by attempting to write first data to the first memory location, determining if the first write operation is successful, and unmapping, in response to the first write operation of being successful, the first memory address from the first spare memory address.

21 Claims, 7 Drawing Sheets

MEMORY LOCATION MAPPING AND UNMAPPING

TECHNICAL FIELD

The present invention relates generally to an electronic system and method, and, in particular embodiments, to a system and method for repairing and releasing memory locations in a memory array.

BACKGROUND

Programmable memories are useful in many applications. There are many different types of programmable memories including, but not limited to, resistive random access memory (RRAM), magnetoresistive random access memory (MRAM), phase change memory (PCM), ferroelectric random access memory (FERAM), programmable read only memory (PROM), electrically erasable ROM (EEPROM) and Flash memory.

In order to improve reliability of programmable memories, in addition to a main memory array area, a spare memory area is sometimes included. If a particular memory cell location of the main memory array area is found to be faulty, the particular memory cell location may be mapped or in instances remapped to a location in the spare memory area. In subsequent write or read operations, data would be written to or read out from the mapped spare memory location. The memory cell location that is considered faulty would not be utilized to store data again. Current techniques require large amounts of spare memory area to meet reliability requirements, and are, therefore, expensive.

SUMMARY

One aspect of an embodiment is a method of operating a memory circuit including a memory array having a memory portion and a spare portion. The method includes receiving a first write command to a first memory address, where the first memory address has a status of being mapped to a first spare memory address, and where the first memory address corresponds to a first memory location in the memory portion and the first spare memory address corresponds to a first spare memory location in the spare portion. The method also includes performing, in response to the first write command, a first write operation by attempting to write first data to the first memory location, determining if the first write operation is successful, and unmapping, in response to the first write operation of being successful, the first memory address from the first spare memory address.

Another aspect of an embodiment is a memory circuit including a memory array including a memory portion and a spare portion, and a controller, configured to perform a first write operation by attempting to write first data to a first memory location in the memory portion, where a first memory address corresponds with the first memory location, and the first memory address has a status of being mapped to a first spare memory address corresponding with a first spare memory location in the spare portion when performing the first write operation, and in response to a determination that the first data was successfully written to the first memory location during the first write operation, unmap the first memory address from the first spare memory address.

Another aspect of an embodiment is a system including an external circuit configured to generate instructions, and a memory circuit configured to receive the instructions from the external circuit, the memory circuit including a memory array including a memory portion and a spare portion, and a controller, configured to, in response to a first instruction from the external circuit perform a first write operation by attempting to write first data to a first memory location in the memory portion, where a first memory address corresponds with the first memory location, and the first memory address has a status of being mapped to a first spare memory address corresponding with a first spare memory location in the spare portion when performing the first write operation, and in response to a determination that the first data was successfully written to the first memory location during the first write operation, unmap the first memory address from the first spare memory address.

BRIEF DESCRIPTION OF THE DRAWINGS

For a more complete understanding of the present invention, and the advantages thereof, reference is now made to the following description taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Some memory technologies are susceptible to errors which cause write operations to fail to change the state of a memory location. In some memory technologies, the failures may be intermittent, such that subsequent successful writing operations may be performed at memory locations having previous failed writing operations. Memory technologies which are susceptible to intermittent errors include, but are not limited to, resistive random access memory (RRAM), magnetoresistive random access memory (MRAM), phase change memory (PCM), ferroelectric random access memory (FERAM), programmable read only memory (PROM), electrically erasable ROM (EEPROM) and Flash memory For example, some memories use filament technologies to conditionally establish a low resistance conductive path between addressable electrodes of a memory cell, where the logic state of the memory cell is encoded in the conductivity state. When the connection and disconnection of the filament is properly induced by the writing control signals, the writing operations are successful. And conversely, when the connection and disconnection of the filament is not properly induced by the writing control signals, the writing operations are not successful.

When writing to such a filament based memory or other types of memory, sometimes a write operation fails to properly change the conductivity state or other corresponding parameter(s) of the memory cell, for example, as determined by a subsequent read operation to determine whether the write operation was successful. In some embodiments, when a write operation to a first memory location is not successful, the data to be stored in the first memory location is written to another memory location, for example, in a physical spare memory area. In one embodiment, the first memory location may be considered or labeled as failed memory bits or failed bits. In some embodiments, failed bits may be permanently discarded and never be used to store data.

In addition, the address of the first memory location is mapped to the address of the physical spare memory location to which the data was written, or in embodiments considered failed bits. For example, the first memory address may be stored in a mapping lookup table associating the first memory address and the address of the physical spare memory location to which the data was written. Consequently, subsequent read operations attempting to read data from the first memory address, after referencing the mapping lookup table, identify the address of the spare memory location, and fetch and return the data stored in the physical spare memory location to which the data was written.

In some memory technologies, the failures may be intermittent, such that subsequent successful writing operations may be performed at memory locations having previous failed writing operations or failed bits. Advantageously, various embodiments discussed herein reuse memory locations which have previously failed writing operations or been labeled failed bits. Accordingly, memories having features discussed herein have improved reliability. Some memories having features discussed herein may use less area because less spare memory may be used.

For example, after a particular memory location has failed a write operation, subsequent read operations access the spare memory location to which the memory location has been mapped. However, subsequent write operations may be performed on the memory location. As a result, the memory location is once again available for writing operations. Consequently, the memory location is not forever discarded, and reliability of the memory is improved and/or less physical spare memory is used.

Figure 1:
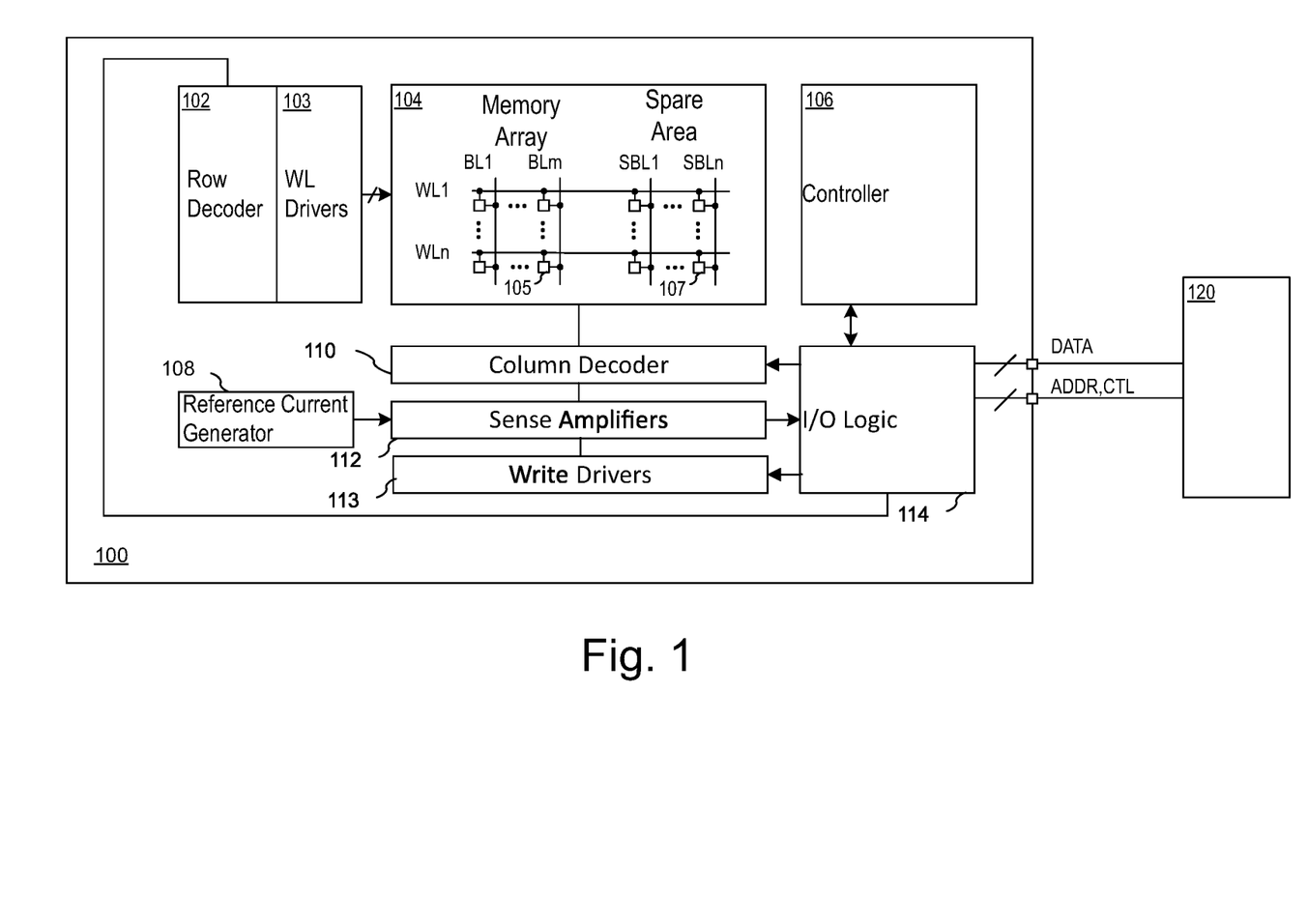
FIG. 1 illustrates a block diagram of an embodiment of a memory system according to some embodiments of the present invention.

FIG. 1 illustrates an embodiment memory system that includes memory 100. As shown, memory 100 includes memory array 104, row decoder 102, word line drivers 103, controller 106, sense amplifiers 112, write drivers 113, column decoder 110, I/O logic 114 coupled to an external data bus, and reference current generator 108. In another embodiment, memory 100 may include more than one memory arrays 104 (not shown). Reference current generator 108 may also be referred to as an adjustable current source. In some embodiments, memory 100 may be coupled to an external circuit 120, for example, as part of a computer system.

In various embodiments, the components of memory 100 may be disposed on a single monolithic semiconductor integrated circuit, such as a single semiconductor substrate, and/or on the same monolithic semiconductor integrated circuit as other disclosed system components.

As shown, memory array 104 includes a memory array of memory cells 105 and a spare area of memory cells 107. In one embodiment, memory array of memory cells 105 and a spare area of memory cells 107 may be disposed physically adjacent to one another. In other embodiments, they may be disposed physically separated from one another, or in different memory arrays 104. Each memory cell 105 is connected to a respective word line (WL1 . . . WLn) and to a respective bit line (BL1 . . . BLm). Similarly, each memory cell 107 is connected to a respective word line (WL1 . . . WLn) and to a respective spare bit line (SBL1 . . . SBLn). Memory array 104 in FIG. 1 illustrates that memory array of memory cells 105 and spare area of memory cells 107 are disposed next to one another and may share word lines. This example is merely one of many embodiments of the present disclosure. In other embodiments, a spare area may be disposed in other physical locations and may not share any word lines or bit lines with memory array memory cells 105. In other embodiments, a spare area may share bit lines with memory area cells 105.

During normal read operations of the memory, row decoder 102 decodes a row address based on address data ADDR provided at the input to I/O logic 114. The decoded row address is used to select one of word lines (WL1 . . . WLn) via word line drivers 103, which activates a row of memory cells 105 that generate respective read currents on respective bit lines (BL1 . . . BLm and SBL1 . . . SBLn). The current of each bit line is compared to a reference current produced by reference current generator 108 using sense amplifiers 112. Column decoder 110 selects columns of memory array 104 to be routed to sense amplifiers 112, the output of which is routed to data lines DATA via I/O logic 114. Controller 106 is a memory controller that controls the operation of the memory. In some embodiments, reference current generator 108 may be implemented using a current digital-to-analog converter (CDAC).

During normal write operations of the memory, row decoder 102 decodes a row address based on address data ADDR provided at the input to I/O logic 114. The decoded row address is used to select one of word lines (WL1 . . . WLn) via word line drivers 103, which activates a row of memory cells 105 and 107 that receive respective write data on respective bit lines (BL1 . . . BLm and SBL1 . . . SBLn) from write drivers 113 according to data provided at the input to I/O logic 114. Those activated memory cells 105 and 107 connected to the selected word line are written with the write data.

In some embodiments, after a write operation or after every write operation, the controller 106 causes a verification read operation to be performed to verify that the write operation was successful. In some embodiments, the verification read operation includes performing a read operation, and if the read operation retrieves data matching that which was written, the write operation is determined to be successful. In some embodiments, if the read operation fails to retrieve data matching that which was written, the write operation is determined to be unsuccessful. In some embodiments, as part of the verification read operation, more than one write and verification read is performed before determining that the write operation is unsuccessful. In one embodiment, more than one write attempt and each followed by a verification read will be performed. If it is verified that all write attempts failed to write the data correctly, the verification read operation may conclude the write operation as a failure or not successful.

In some embodiments, if the controller 106 determines that a write operation to a first memory location was not successful, the controller 106 causes the data that was to be stored in the first memory location to be written to another memory location, for example, in the physical spare memory area.

In addition, the controller 106 may map the address of the first memory location to the address of the physical spare memory location to which the data was written. For example, the controller 106 may store the first memory address in a mapping lookup table associating the first memory address and the address of the physical spare memory location to which the data was written. Consequently, the controller 106 may reference the mapping lookup table as part of performing subsequent read operations, and, after finding that the first memory address is to be read, may cause the read operations to, instead of reading data from the first memory location of the memory array, may retrieve the address of the spare memory location from the mapping lookup table, and fetch and return the data stored in the physical spare memory location to which the data was written.

However, in some embodiments, the controller 106 causes subsequent write operations addressed to the memory location to be performed on the memory location, for example, even if the memory location is currently mapped. Accordingly, despite having previous failed write operations, the memory location is available for subsequent write operations. Consequently, the memory location is not discarded.

Figure 2A:
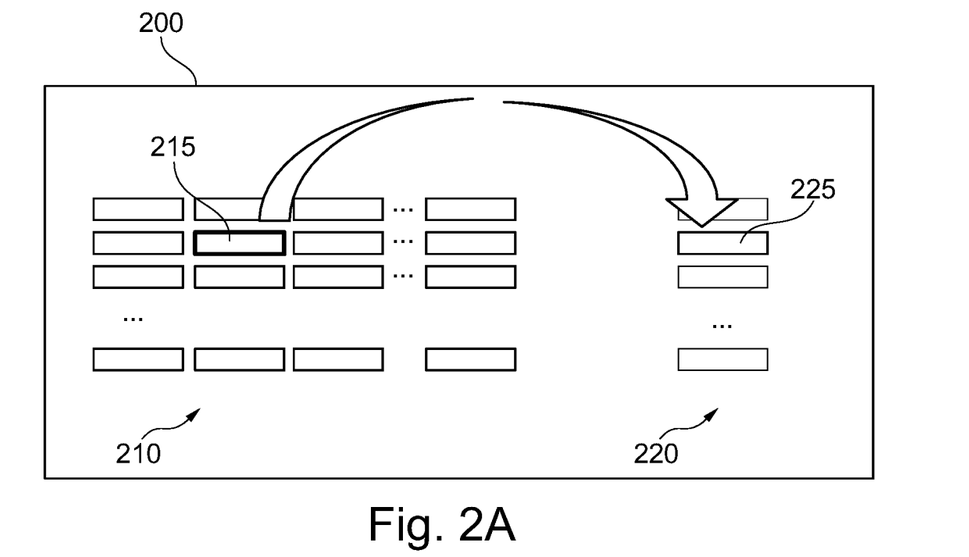
FIGS. 2A and 2B illustrate graphical conceptualizations of methods performed on a portion of a memory according to some embodiments of the present invention.
Figure 2B:
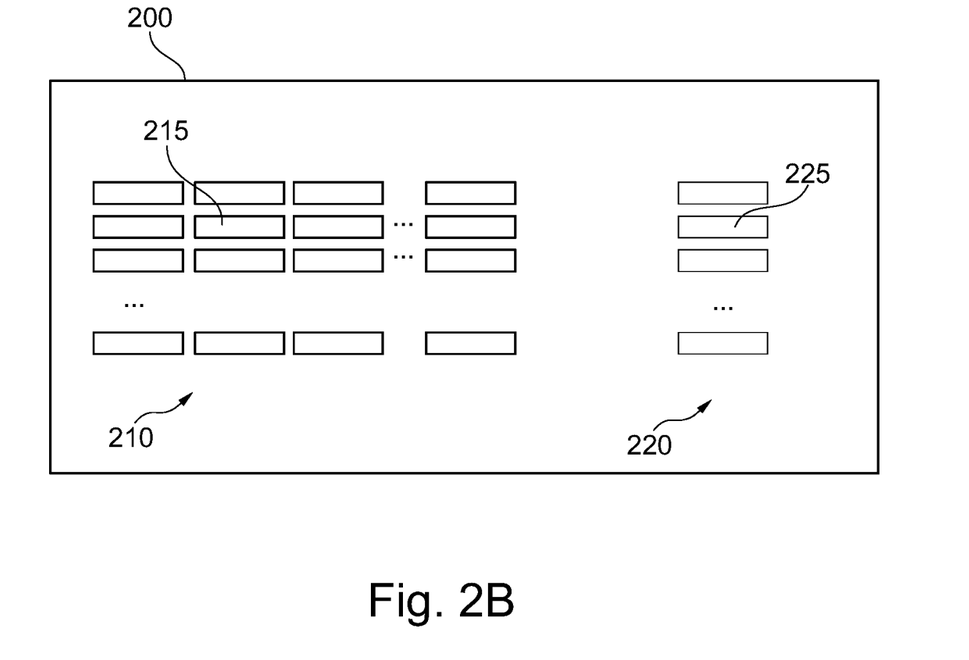

FIGS. 2A and 2B illustrate graphical conceptualizations of methods performed on a portion of a memory 200 according to some embodiments of the present invention. FIGS. 2A and 2B show a memory array area 210 and a spare memory area 220 of memory 200 in different mapping states.

FIG. 2A shows the memory array area 210 having memory location 215 mapped to spare memory location 225 in the spare memory area 220, for example, as a consequence of memory location 215 having failed one or more write operation attempts, depending on the system requirements.

For example, as discussed above, the data which was to have been written to memory location 215 during the failed write operation attempt may have been written, instead, to spare memory location 225. In addition, memory location 215 may have been mapped to spare memory location 225, for example, using a mapping lookup table, as discussed above, for example.

FIG. 2B shows the memory array area 210 having memory location 215 unmapped or released from spare memory location 225 in the spare memory area 220, for example, as a consequence of memory location 215 having subsequently been successfully written to.

For example, as discussed above, a subsequent write attempt may have successfully written data to memory location 215. In addition, spare memory location 225 may be unmapped from memory location 215, for example, by removing the entry in the mapping lookup table associating spare memory location 225 with memory location 215.

Figure 3:
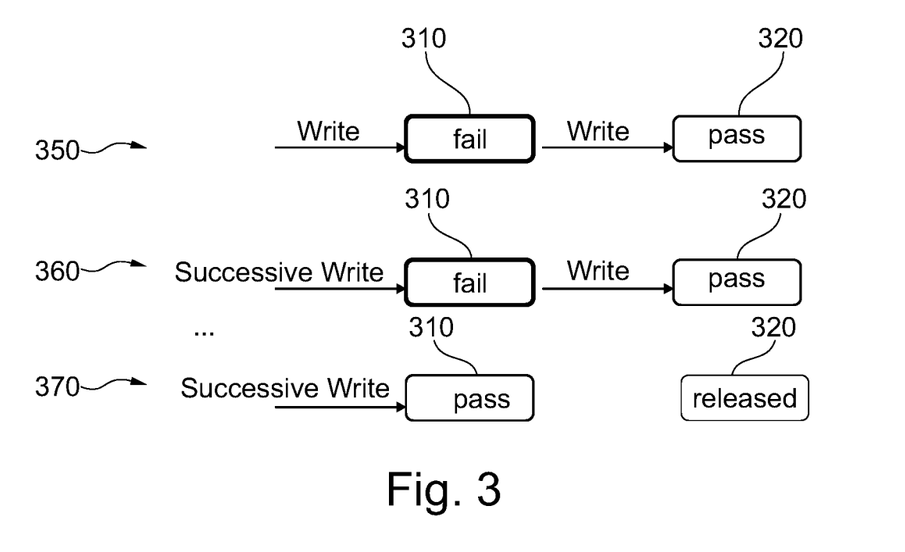
FIG. 3 illustrates a graphical conceptualization of methods according to some embodiments of the present invention.

FIG. 3 illustrates a graphical conceptualization of methods according to some embodiments of the present invention. FIG. 3 shows a memory array location 310 and a spare memory location 320 during different operational phases 350, 360 and 370. In embodiments, each memory array location 310 and spare memory location 320 may include one or more memory cells, such as memory array memory cells 105 and spare area memory cells 107, as best shown in FIG. 1.

During phase 350, the memory attempts to write data to memory array location 310, but the attempt fails. In response to the failed attempt, the memory subsequently writes the data to spare memory location 320. An association of memory locations between memory array location 310 and spare memory location 320 is established, for example via address mapping or remapping. In one embodiment, a subsequent read request of data stored in memory array location 310 will cause data stored in spare memory location 320 to be read out.

Next, during phase 360, the memory attempts to write new data to memory array location 310, but the attempt fails. In response to the failed attempt, the memory subsequently writes the new data to spare memory location 320, which is already associated with memory array location 310 via previous mapping in phase 350.

During phase 370, after phase 360, the memory attempts to write next data to memory array location 310, and the attempt succeeds. In response to the successful attempt, the memory subsequently disassociates or unmaps spare memory location 320 from memory array location 310. Accordingly, because of being unmapped, spare memory location 320 is available to be used as a spare if a subsequent attempt to write data to memory array location 310 or another memory location fails. In one embodiment, any subsequent read request of data stored in memory array location 310 will no longer be read out from spare memory location 320.

Figure 4:
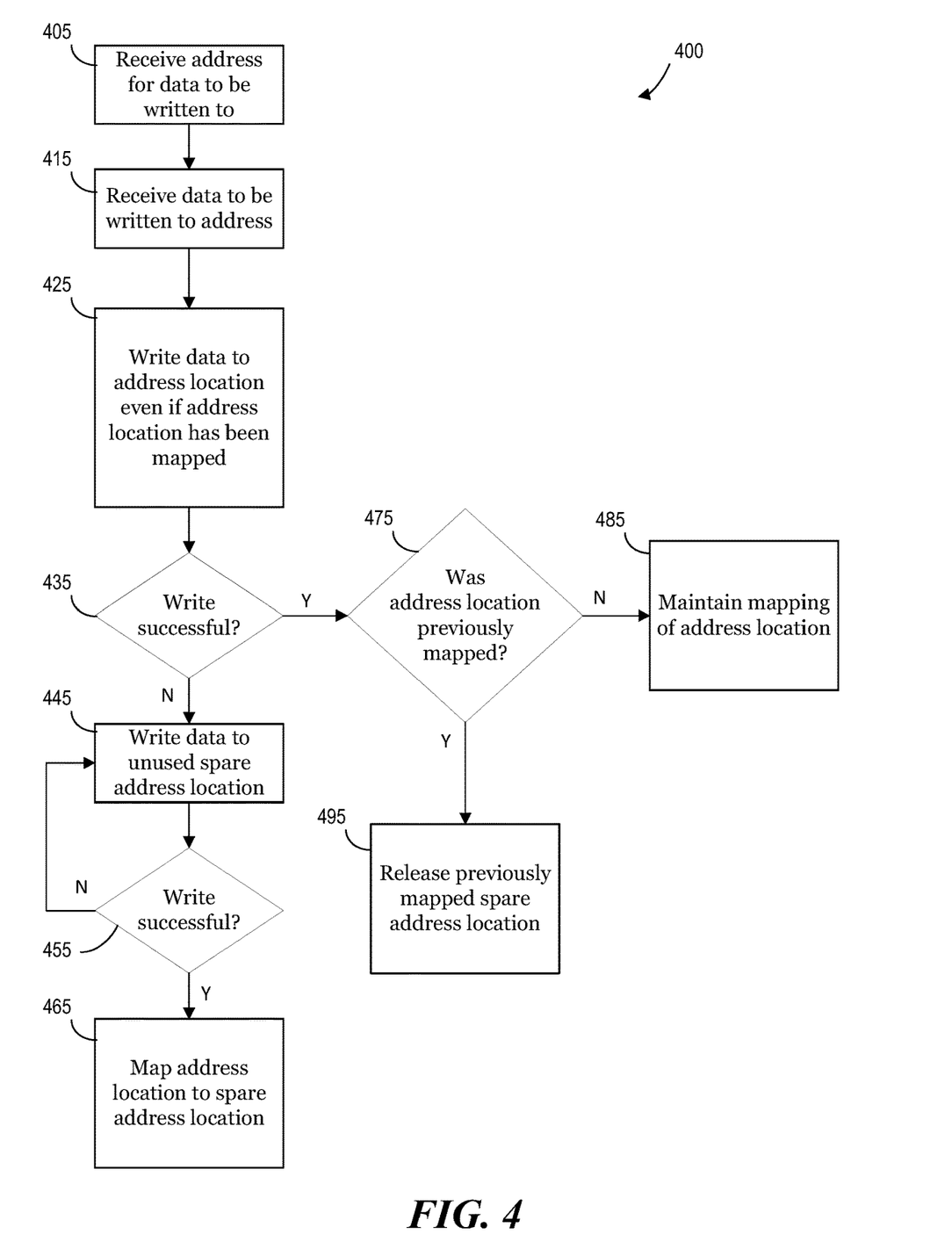
FIG. 4 illustrates a flowchart diagram of a method of using a memory according to some embodiments of the present invention.

FIG. 4 illustrates a flowchart diagram of a method 400 of using a memory according to some embodiments of the present invention. Method 400 may be performed, for example, by a memory, such as memory 100.

At step 405, the controller of the memory receives an address for data to be written to. For example, the address may be part of a data communication received from an external circuit.

At step 415, the controller of the memory receives data for the write operation. For example, the data may be part of the data communication received from the external circuit which also included the address the data is to be written to. In some embodiments, the data communication also indicates that the operation to be performed is a write operation.

At step 425, the controller of the memory causes a write operation to be performed which attempts to write the data received at step 415 to the memory location corresponding with the address received at step 405. In some embodiments, the controller causes the write operation to be performed even if previous attempts to write data to the memory location corresponding with the address received at step 405 have failed and the address received at step 405 is currently mapped. For example, in some embodiments, the controller does not access a mapping lookup table to determine whether the address received at step 405 is in the mapping lookup table or is associated with another memory location in the mapping lookup table as part of the write operation or as a condition for the write operation.

At step 435, the controller determines whether the write operation performed at step 425 was successful. In some embodiments, the controller causes a verification read operation to be performed to access the data stored at the memory location corresponding with the address received at step 405 to determine whether the data stored at the memory location corresponding with the address received at step 405 matches the data received at step 415 and which was the subject of the write operation at step 425. In some embodiments, the write operation may be determined as not successful after one or more than one consecutive failed write attempts and verification read operations.

If, at 435, the controller determines that the write operation was not successful, at 445, the controller of the memory causes a write operation to be performed which attempts to write the data received at step 415 to a memory location corresponding with a second memory address, such as a memory address for a memory located in a spare area of the memory.

At step 455, the controller determines whether the write operation performed at step 445 was successful. In some embodiments, the controller causes a read operation to be performed to access the data stored using the second memory address to determine whether the data stored with the address received at step 405 matches the data received at 415 and which was the subject of the write operation of step 445. In some embodiments, the write operation may be determined as not successful after one or more than one consecutive failed verification read operations.

If the controller determines, at step 455, that the write operation was not successful, at step 445, the controller of the memory causes a write operation to be performed which attempts to write the data received at step 415 to another memory location, such as a memory location in a spare area of the memory.

If the controller determines, at step 455, that the write operation was successful, at step 465, the controller of the memory causes the address received at step 405 to be mapped to the other memory address to which the data received at step 415 was successfully written. For example, the address received at step 405 may be stored in a mapping lookup table associating the address received at step 405 and the address of the other memory address to which the data received at step 415 was successfully written.

If, at step 435, the controller determines that the write operation was successful, at step 475, the controller of the memory determines whether the address received at step 405 is mapped to another memory address. For example, the controller may access a mapping lookup table to determine whether the address received at step 405 is in the mapping lookup table or is associated with another memory location in the mapping lookup table.

If, at step 475, the controller determines that the address received at step 405 is not in the mapping lookup table nor associated with another memory location in the mapping lookup table, at step 485, the controller maintains the current mapping of the address received at step 405. For example, the controller may refrain from writing the address received at step 405 in the mapping lookup table.

If, at step 475, the controller determines that the address received at step 405 is in the mapping lookup table or is associated with another memory location in the mapping lookup table, at step 495, the controller maintains the original mapping of the address received at step 405. For example, the controller may unmap or disassociate the current mapping of the address received from the address received at step 405. For example, the controller may remove an entry in the mapping lookup table associating the other memory location with the memory location received at step 405.

Figure 5:
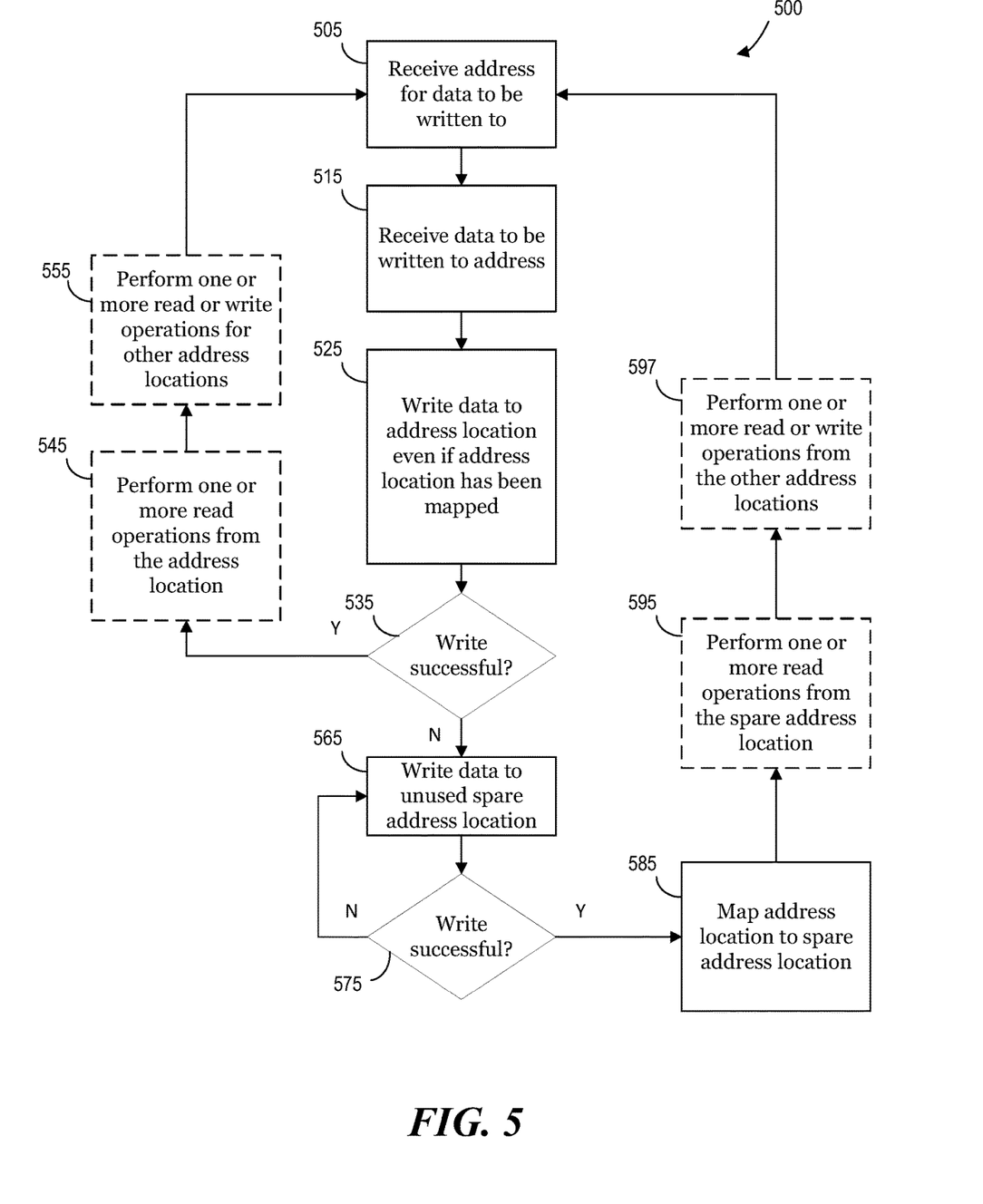
FIG. 5 illustrates a flowchart diagram of a method of using a memory according to some embodiments of the present invention.

FIG. 5 illustrates a flowchart diagram of a method 500 of using a memory according to some embodiments of the present invention. Method 500 may be performed, for example, by a memory, such as memory 100.

At step 505, the controller of the memory receives an address for data to be written to. For example, the address may be part of a data communication received from an external circuit.

At step 515, the controller of the memory receives data for the write operation. For example, the data may be part of the data communication received from the external circuit which also included the address the data is to be written to. In some embodiments, the data communication also indicates that the operation to be performed is a write operation.

At step 525, the controller of the memory causes a write operation to be performed which attempts to write the data received at step 515 to the memory location corresponding with the address received at step 505. In some embodiments, the controller causes the write operation to be performed even if previous attempts to write data with the address received at step 505 have failed (the memory location corresponds with the address labeled as "failed bits") and the address received at step 505 is currently mapped. For example, in some embodiments, the controller does not access a mapping lookup table to determine whether the address received at step 505 is in the mapping lookup table or is associated with another memory location in the mapping lookup table as part of the write operation or as a condition for the write operation.

At step 535, the controller determines whether the write operation performed at step 525 was successful. In some embodiments, the controller causes a verification read operation to be performed with the address received at step 505 to determine whether the data stored at the address received at step 505 matches the data received at step 515 and which was the subject of the write operation at step 525.

If, at step 535, the controller determines that the write operation was successful, at step 545, the controller of the memory may optionally cause one or more write attempts and read operations to be performed, for example, in response to one or more read instructions requesting data from the memory location corresponding with the address received at step 505.

At step 555, the controller of the memory may optionally cause one or more read or write operations to be performed, for example, in response to one or more read or write instructions requesting data from one or more addresses different from the address received at step 505 or requesting data to be written to one or more addresses different from the address received at step 505.

If, at step 535, the controller determines that the write operation was not successful, at step 565, the controller of the memory causes a write operation to be performed which attempts to write the data received at step 515 to a location corresponding with a second memory address, such as a memory location in a spare area of the memory.

At step 575, the controller determines whether the write operation performed at step 565 was successful. In some embodiments, the controller causes a read operation to be performed to determine whether the data stored at the address received at step 505 matches the data received at 515 and which was the subject of the write operation at step 565.

If the controller determines, at step 575, that the write operation was not successful, at step 565, the controller of the memory causes a write operation to be performed which attempts to write the data received at step 515 to a memory location corresponding with another memory address, such as a memory address for a spare area of the memory.

If the controller determines, at step 575, that the write operation was successful, at step 585, the controller of the memory causes the address received at step 505 to be mapped to the other memory address to which the data received at step 515 was successfully written. For example, the address received at step 505 may be stored in a mapping lookup table associating the address received at step 505 and the address of the other memory address to which the data received at step 515 was successfully written.

At step 595, the controller of the memory may optionally cause one or more read operations to be performed, for example, in response to one or more read instructions requesting data from the memory location corresponding with the address received at step 505.

At step 597, the controller of the memory may optionally cause one or more read or write operations to be performed, for example, in response to one or more read or write instructions requesting data from one or more addresses different from the address received at step 505 or requesting data to be written to one or more addresses different from the address received at step 505.

Figure 6:
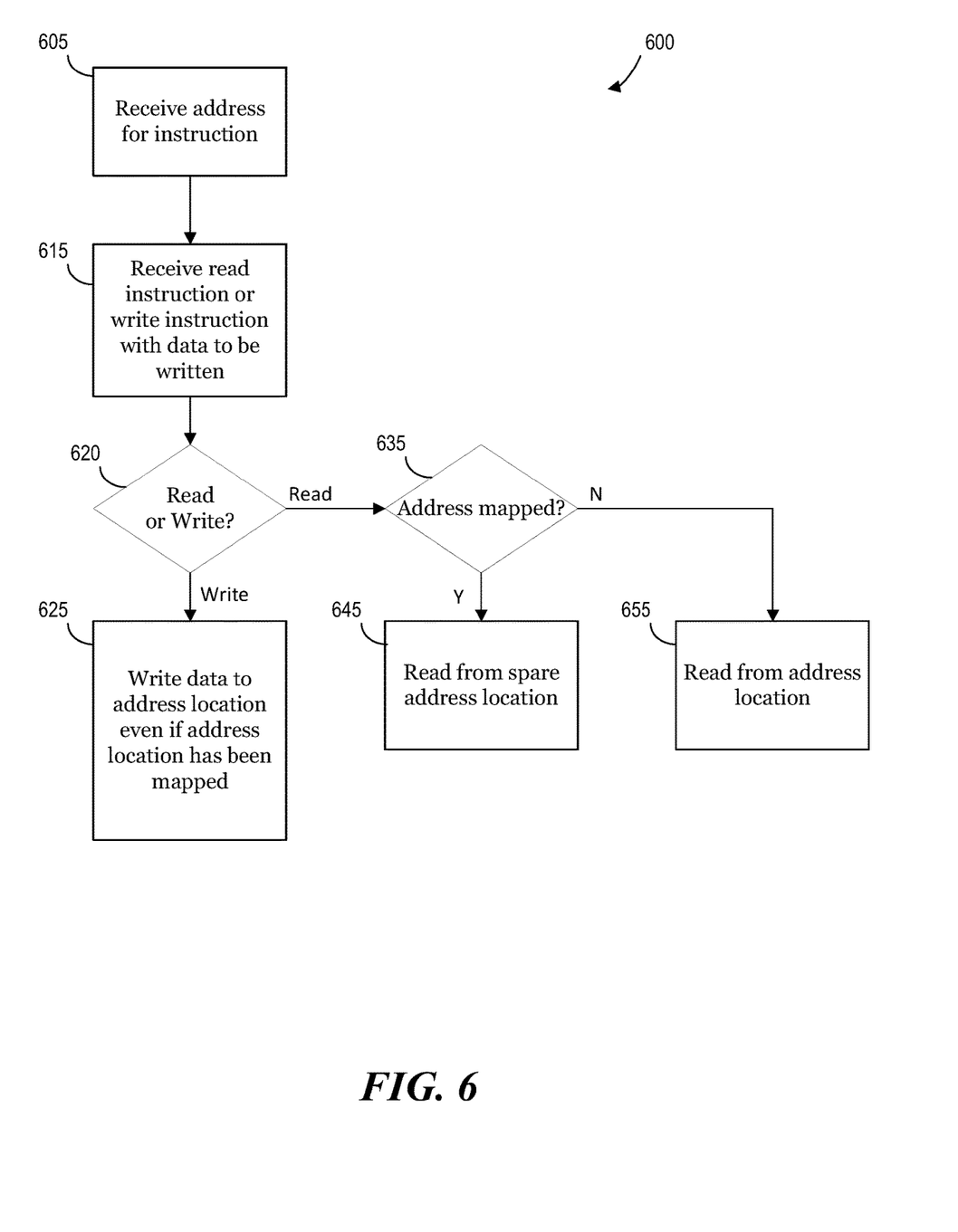
FIG. 6 illustrates a flowchart diagram of a method of using a memory according to some embodiments of the present invention.

FIG. 6 illustrates a flowchart diagram of a method 600 of using a memory according to some embodiments of the present invention. Method 600 may be performed, for example, by a memory, such as memory 100.

At step 605, the controller of the memory receives an address for an instruction. The instruction may be, for example, for a read operation which reads data from the address or the instruction may be, for example, for a write operation which to write data to the address. The address may be, for example, part of a data communication received from an external circuit.

At step 615, the controller of the memory receives data identifying the instruction. For example, the controller may receive data indicating that the instruction is for a read operation which reads data using the address. Alternatively, the controller may receive data indicating that the instruction is for a write operation which to write data to the address. Accordingly, the controller may also receive the data to be written for the write instruction. The data may be, for example, part of the data communication received from the external circuit which also includes the address received at 605.

At step 620, the controller determines that the instruction received at step 615 is for a write operation or determines that the instruction received at 615 is for a read operation.

If at step 620 the controller determines that the instruction received at step 615 is for a write operation, at step 625, the controller of the memory causes a write operation to be performed which attempts to write the data received at step 615 to the memory location corresponding with the address received at step 605. In some embodiments, the controller causes the write operation to be performed even if previous attempts to write data to the memory location corresponding with the address received at step 605 have failed and the address received at step 405 is currently mapped. For example, in some embodiments, the controller does not access a mapping lookup table to determine whether the address received at step 605 is in the mapping lookup table or is associated with another memory location in the mapping lookup table as part of the write operation or as a condition for the write operation.

In some embodiments, at step 625, the control also performs other actions described above, for example, with reference to methods 400 and 500. For example, the controller may determine whether the write operation was successful, and perform further actions to implement mapping and unmapping techniques according to principles and aspects described elsewhere herein.

If at step 620 the controller determines that the instruction received at step 615 is for a read operation, at step 635, the controller of the memory determines whether the address received at step 605 is mapped to an alternative memory location.

If at step 635 the controller of the memory determines that the address received at step 605 is mapped to an alternative memory location, the controller causes data to be read from the alternative memory location, and returns the fetched data as a response to the read instruction received at step 615.

If at step 635 the controller of the memory determines that the address received at step 605 is not mapped to an alternative memory location, the controller causes data to be read from the memory location corresponding with the address received at step 605, and returns the fetched data as a response to the read instruction received at step 615.

Figure 7:
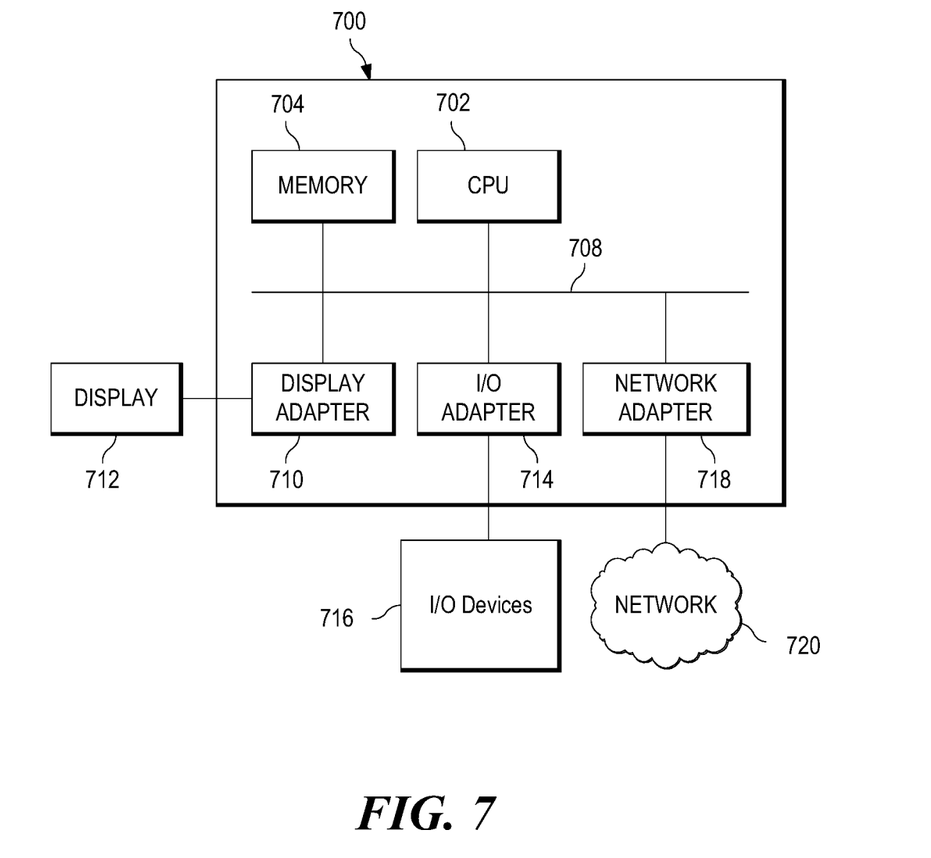
FIG. 7 illustrates a processing system that can be used to implement portions of embodiment systems.

FIG. 7 illustrates a processing system that can be used to implement portions of embodiment systems.

Referring now to FIG. 7, a block diagram of a processing system 700 is provided in accordance with an embodiment of the present invention. The processing system 700 depicts a general-purpose platform and the general components and functionality that may use embodiments described herein, such as memory 100. For example, processing system 700 may be used to implement some or all of the processing used to implement all or portions of the embodiment methods described herein.

Processing system 700 may include, for example, a central processing unit (CPU) 702, and memory 704 connected to a bus 708. Memory 704 may be or include an embodiment of memory 100. Processing system 700 may be configured to perform the processes discussed above according to programmed instructions stored in memory 704 or on other non-transitory computer readable media. The processing system 700 may further include, if desired or needed, a display adapter 710 to provide connectivity to a local display 712 and an input-output (I/O) adapter 714 to provide an input/output interface for one or more input/output devices 716, such as a mouse, a keyboard, flash drive or the like.

The processing system 700 may also include a network interface 718, which may be implemented using a network adaptor configured to be coupled to a wired link, such as a network cable, USB interface, or the like, and/or a wireless/cellular link for communications with a network 720. The network interface 718 may also comprise a suitable receiver and transmitter for wireless communications. It should be noted that the processing system 700 may include other components. For example, the processing system 700 may include hardware components power supplies, cables, a motherboard, removable storage media, cases, and the like if implemented externally. These other components, although not shown, may be considered to be part of the processing system 700. In some embodiments, processing system 700 may be implemented on a single monolithic semiconductor integrated circuit and/or on the same monolithic semiconductor integrated circuit as other disclosed system components.

Embodiments of the present invention are summarized here. Other embodiments can also be understood from the entirety of the specification and the claims filed herein.

Example 1. A method of operating a memory circuit, the memory circuit including a memory array having a memory portion and a spare portion, the method including: receiving a first write command to a first memory address, where the first memory address has a status of being mapped to a first spare memory address, and where the first memory address corresponds to a first memory location in the memory portion and the first spare memory address corresponds to a first spare memory location in the spare portion; performing, in response to the first write command, a first write operation by attempting to write first data to the first memory location; determining if the first write operation is successful; and unmapping, in response to the first write operation of being successful, the first memory address from the first spare memory address.

Example 2. The method of example 1, where the first memory address having the status of being mapped to the first spare memory address indicates that the first memory location is considered failed memory bits.

Example 3. The method of one of examples 1 or 2, subsequent to the first spare memory address being unmapped from the first memory address, further including:

Example 4. The method of one of examples 1 to 3, where unmapping the first memory address from the first spare memory address includes disassociating the first memory address from the first spare memory address in a lookup table.

Example 5. The method of one of examples 1 to 4, further including: performing a second write operation by attempting to write second data to the first memory location when the first memory address does not have a status of being mapped to a spare memory address; and in response to a determination that the second data was not successfully written to the first memory location: mapping the first memory address to a second spare memory address, where the second spare memory address is not mapped to any memory address; and writing the second data to a second spare memory location in the spare portion, the second spare memory location corresponding with the second spare memory address.

Example 6. The method of one of examples 1 to 5, where the first spare memory location is the same as the second spare memory location.

Example 7. The method of one of examples 1 to 6, where mapping the first memory address to the second spare memory address includes associating the first memory address with the second spare memory address in a lookup table.

Example 8. The method of one of examples 1 to 7, further including, before performing the first write operation, reading data for the first memory address from the first spare memory location.

Example 9. The method of one of examples 1 to 8, where determining if the first write operation is successful further including:

Example 10. The method of one of examples 1 to 9, where the memory portion is physically separated from the spare portion in the memory array.

Example 11. A memory circuit, including: a memory array including a memory portion and a spare portion; and a controller, configured to: perform a first write operation by attempting to write first data to a first memory location in the memory portion, where a first memory address corresponds with the first memory location, and the first memory address has a status of being mapped to a first spare memory address corresponding with a first spare memory location in the spare portion when performing the first write operation; and in response to a determination that the first data was successfully written to the first memory location during the first write operation, unmap the first memory address from the first spare memory address.

Example 12. The memory circuit of example 11, where the memory portion of the memory array and the spare portion of the memory array include resistive random access memory (RRAM) cells.

Example 13. The memory circuit of one of examples 11 or 12, where the controller is configured to unmap the first memory address from the first spare memory address by disassociating the first memory address from the first spare memory address in a lookup table.

Example 14. The memory circuit of one of examples 11 to 13, where the controller is configured to: perform a second write operation by attempting to write second data to the first memory location when the first memory address does not have a status of being mapped to a spare memory address; and in response to a determination that the second data was not successfully written to the first memory location: write the second data to a second spare memory location in the spare portion, the second spare memory location corresponding with a second spare memory address; and map the first memory address to the second spare memory address.

Example 15. The memory circuit of example 14, where the controller is configured to map the first memory address to the second spare memory address by associating the first memory address with the second spare memory address in a lookup table.

Example 16. The memory circuit of one of examples 11 to 15, where the controller is configured to, before the first write operation is performed, read data for the first memory address from the first spare memory location.

Example 17. The memory circuit of example 16, where the controller is configured to, after the first memory address is unmapped from the first spare memory address, read data for the first memory address from the first memory location.

Example 18. A system, including: an external circuit configured to generate instructions; and a memory circuit configured to receive the instructions from the external circuit, the memory circuit including: a memory array including a memory portion and a spare portion; and a controller, configured to, in response to a first instruction from the external circuit: perform a first write operation by attempting to write first data to a first memory location in the memory portion, where a first memory address corresponds with the first memory location, and the first memory address has a status of being mapped to a first spare memory address corresponding with a first spare memory location in the spare portion when performing the first write operation; and in response to a determination that the first data was successfully written to the first memory location during the first write operation, unmap the first memory address from the first spare memory address.

Example 19. The system of example 18, where the controller is configured to unmap the first memory address from the first spare memory address by disassociating the first memory address from the first spare memory address in a lookup table.

Example 20. The system of one of examples 18 or 19, where the controller is configured to, in response to a second instruction from the external circuit:

Example 21. The system of one of examples 18 to 20, where the controller is configured to: before the first write operation is performed, read data for the first memory address from the first spare memory location; and after the first memory address is unmapped from the first spare memory address, read data for the first memory address from the first memory location.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a memory circuit, the memory circuit comprising a memory array having a memory portion and a spare portion, the method comprising:
receiving a first write command to a first memory address, wherein the first memory address has a status of being mapped to a first spare memory address, and wherein the first memory address corresponds to a first memory location in the memory portion and the first spare memory address corresponds to a first spare memory location in the spare portion;
performing, in response to the first write command, a first write operation by attempting to write first data to the first memory location;
determining if the first write operation is successful; and
unmapping, in response to the first write operation of being successful, the first memory address from the first spare memory address.

2. The method of claim 1, wherein the first memory address having the status of being mapped to the first spare memory address indicates that the first memory location is considered failed memory bits.

3. The method of claim 1, subsequent to the first spare memory address being unmapped from the first memory address, further comprising:
mapping a second memory address to the first spare memory address, wherein a second memory location associated with the second memory address is considered failed bits.

4. The method of claim 1, wherein unmapping the first memory address from the first spare memory address comprises disassociating the first memory address from the first spare memory address in a lookup table.

5. The method of claim 1, further comprising:
performing a second write operation by attempting to write second data to the first memory location when the first memory address does not have a status of being mapped to a spare memory address; and
in response to a determination that the second data was not successfully written to the first memory location:
mapping the first memory address to a second spare memory address, wherein the second spare memory address is not mapped to any memory address, and
writing the second data to a second spare memory location in the spare portion, the second spare memory location corresponding with the second spare memory address.

6. The method of claim 5, wherein the first spare memory location is the same as the second spare memory location.

7. The method of claim 5, wherein mapping the first memory address to the second spare memory address comprises associating the first memory address with the second spare memory address in a lookup table.

8. The method of claim 1, further comprising, before performing the first write operation, reading data for the first memory address from the first spare memory location.

9. The method of claim 1, wherein determining if the first write operation is successful further comprising:
performing at least one verification read operation to verify if the first data is written to the first memory location successfully.

10. The method of claim 1, wherein the memory portion is physically separated from the spare portion in the memory array.

11. A memory circuit, comprising:
a memory array comprising a memory portion and a spare portion; and
a controller, configured to:
perform a first write operation by attempting to write first data to a first memory location in the memory portion, wherein a first memory address corresponds with the first memory location, and the first memory address has a status of being mapped to a first spare memory address corresponding with a first spare memory location in the spare portion when performing the first write operation, and
in response to a determination that the first data was successfully written to the first memory location during the first write operation, unmap the first memory address from the first spare memory address.

12. The memory circuit of claim 11, wherein the memory portion of the memory array and the spare portion of the memory array comprise resistive random access memory (RRAM) cells.

13. The memory circuit of claim 11, wherein the controller is configured to unmap the first memory address from the first spare memory address by disassociating the first memory address from the first spare memory address in a lookup table.

14. The memory circuit of claim 11, wherein the controller is configured to:
perform a second write operation by attempting to write second data to the first memory location when the first memory address does not have a status of being mapped to a spare memory address; and
in response to a determination that the second data was not successfully written to the first memory location:
write the second data to a second spare memory location in the spare portion, the second spare memory location corresponding with a second spare memory address, and
map the first memory address to the second spare memory address.

15. The memory circuit of claim 14, wherein the controller is configured to map the first memory address to the second spare memory address by associating the first memory address with the second spare memory address in a lookup table.

16. The memory circuit of claim 11, wherein the controller is configured to, before the first write operation is performed, read data for the first memory address from the first spare memory location.

17. The memory circuit of claim 16, wherein the controller is configured to, after the first memory address is unmapped from the first spare memory address, read data for the first memory address from the first memory location.

18. A system, comprising:
an external circuit configured to generate instructions; and
a memory circuit configured to receive the instructions from the external circuit, the memory circuit comprising:

a memory array comprising a memory portion and a spare portion, and a controller, configured to, in response to a first instruction from the external circuit:

perform a first write operation by attempting to write first data to a first memory location in the memory portion, wherein a first memory address corresponds with the first memory location, and the first memory address has a status of being mapped to a first spare memory address corresponding with a first spare memory location in the spare portion when performing the first write operation, and in response to a determination that the first data was successfully written to the first memory location during the first write operation, unmap the first memory address from the first spare memory address.

19. The system of claim 18, wherein the controller is configured to unmap the first memory address from the first spare memory address by disassociating the first memory address from the first spare memory address in a lookup table.

20. The system of claim 18, wherein the controller is configured to:

in response to a second instruction from the external circuit:

perform a second write operation by attempting to write second data to the first memory location when the first memory address does not have a status of being mapped to a spare memory address; and in response to determining that the second data was not successfully written to the first memory location:

map the first memory address to a second spare memory address, and write the second data to a second spare memory location in the spare portion, the second spare memory location corresponding with a second spare memory address.

21. The system of claim 18, wherein the controller is configured to:

before the first write operation is performed, read data for the first memory address from the first spare memory location; and after the first memory address is unmapped from the first spare memory address, read data for the first memory address from the first memory location.

* * * * *